United States Patent
Kim

(10) Patent No.: US 10,770,528 B2
(45) Date of Patent: Sep. 8, 2020

(54) ORGANIC LIGHT EMITTING DISPLAY DEVICE

(71) Applicant: LG Display Co., Ltd., Seoul (KR)

(72) Inventor: Kanghyun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/706,212

(22) Filed: Dec. 6, 2019

(65) Prior Publication Data
US 2020/0194521 A1    Jun. 18, 2020

(30) Foreign Application Priority Data
Dec. 12, 2018   (KR) .................. 10-2018-0160028

(51) Int. Cl.
*H01L 51/00* (2006.01)
*H01L 27/32* (2006.01)
*H01L 51/52* (2006.01)

(52) U.S. Cl.
CPC ...... *H01L 27/3246* (2013.01); *H01L 27/3216* (2013.01); *H01L 27/3218* (2013.01); *H01L 51/5209* (2013.01)

(58) Field of Classification Search
CPC ............. H01L 27/3246; H01L 27/3258; H01L 51/5203; H01L 51/5209; H05B 33/08; H05B 33/10; H05B 33/20; H05B 33/22; H05B 33/26
See application file for complete search history.

(56) References Cited

U.S. PATENT DOCUMENTS

2002/0158835 A1* 10/2002 Kobayashi .......... H01L 51/5218
  345/100
2014/0312319 A1* 10/2014 Kim .................... H01L 27/3258
  257/40

* cited by examiner

*Primary Examiner* — Robert G Bachner
(74) *Attorney, Agent, or Firm* — Polsinelli PC

(57) ABSTRACT

An organic light emitting display device comprises a substrate on which a plurality of sub-pixels are arranged in a column direction and a row direction; a plurality of first electrodes respectively allocated to the plurality of sub-pixels; a first bank disposed between the plurality of first electrodes neighboring in the column direction and having a plurality of first openings that exposes the plurality of first electrodes arranged in the row direction; a second bank disposed between the plurality of first electrodes neighboring in the row direction and having a plurality of second openings that exposes the plurality of first electrodes arranged in the column direction, wherein each of the plurality of first electrodes includes a head portion having a first width in the row direction and a neck portion having a second width less than the first width and extending from one side of the head portion in the column direction, wherein the head portion of the first electrodes arranged in an odd column neighbors the neck portion of the first electrodes arranged in an even column along the row direction, and wherein the neck portion of the first electrodes arranged in an odd column neighbors the head portion of the first electrodes arranged in an even column along the row direction.

20 Claims, 16 Drawing Sheets

ORGANIC LIGHT EMITTING DISPLAY DEVICE

CROSS REFERENCE TO RELATED APPLICATION

This application claims the priority benefit of Korean Patent Application No. 10-2018-0160028 filed on Dec. 12, 2018, which is hereby incorporated by reference in its entirety.

BACKGROUND

Field of the Disclosure

The present disclosure relates to an organic light emitting display device, and more particularly, to an organic light emitting display device that can improve display quality deterioration caused by a thickness deviation in an organic emission layer.

Description of the Background

Recently, various display devices which are light and compact and thus can supplement the weakness of cathode ray tubes have been developed. Such display devices include a liquid crystal display (LCD), a plasma display panel (PDP), a field emission display (FED), an organic light emitting display device, etc.

Light emitting display devices are spontaneous emission devices and have the advantages of a high response speed, high emission efficiency, high luminance and a wide viewing angle. Further, flexible display devices can be realized because elements can be formed on a flexible substrate such as a plastic substrate.

As large-area high-definition organic light emitting display devices are required, a single panel includes a plurality of sub-pixels. A mask is used for patterning of red, green and blue sub-pixels, in general. Accordingly, to realize large-area display devices, a large-area fine metal mask (FMM) corresponding thereto is needed. However, a mask is bent as the area thereof increases to causes various problems such as deposition of an organic light-emitting material forming an emission layer at an incorrect position.

To solve problems in a deposition method using the aforementioned mask, a solution process which is simple and suitable for large areas attracts interest. The solution process can perform large-area patterning through inkjet printing or nozzle printing without a mask and has a very high material use rate of about 50 to 80% compared to evaporation having a material use rate of less than 10%. In addition, the solution process has a higher glass transition temperature than evaporation and thus can provide high thermal stability and morphology property.

However, when an emission layer is formed through the solution process, a thickness deviation due to positions in sub-pixels may cause thickness non-uniformity, leading to considerable deterioration of display quality.

SUMMARY

Accordingly, the present disclosure is directed to an organic light emitting display device that substantially obviates one or more of problems due to limitations and disadvantages of the prior art.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

More specifically, the present disclosure provides an organic light emitting display device capable of improving display quality deterioration due to a thickness deviation in an organic emission layer.

In addition, the present disclosure provides an organic light emitting display device for realizing high definition while preventing failure due to color mixing.

An organic light emitting display device according to the present disclosure includes a substrate, first electrodes, a first bank and a second bank. A plurality of sub-pixels is arranged in a column direction and a row direction on the substrate. The first electrodes are respectively allocated to the sub-pixels. The first bank is disposed between first electrodes neighboring in the column direction and has first openings for exposing a plurality of first electrodes arranged in the row direction. The second bank is disposed between first electrodes neighboring in the row direction and has second openings for exposing a plurality of first electrodes arranged in the column direction. Each of the first electrodes includes a head portion and a neck portion. The head portion has a first width in the row direction. The neck portion has a second width less than the first width and extends from one side of the head portion in the column direction. The head portion of a first electrode arranged in an odd column neighbors the neck portion of a first electrode arranged in an even column along the row direction. The neck portion of a first electrode arranged in an odd column neighbors the head portion of a first electrode arranged in an even column along the row direction.

BRIEF DESCRIPTION OF THE DRAWINGS

The accompanying drawings, which are included to provide a further understanding of the disclosure and are incorporated in and constitute a part of this disclosure, illustrate aspects of the disclosure and together with the description serve to explain the principles of the disclosure.

In the drawings.

DETAILED DESCRIPTION

Hereinafter, the present disclosure will be described in detail through aspects with reference to the accompanying drawings. The same reference numbers will be used throughout this specification to refer to the same or like parts. In the following description of the present disclosure, a detailed description of known functions and configurations incorporated herein will be omitted when it may obscure the subject matter of the present disclosure. In description of various aspects, the same components may be representatively described at the beginning and omitted in other aspects.

In the following description of the aspects, "first" and "second" are used to describe various components, but such components are not limited by these terms. The terms are used to discriminate one component from another component.

Figure 1:
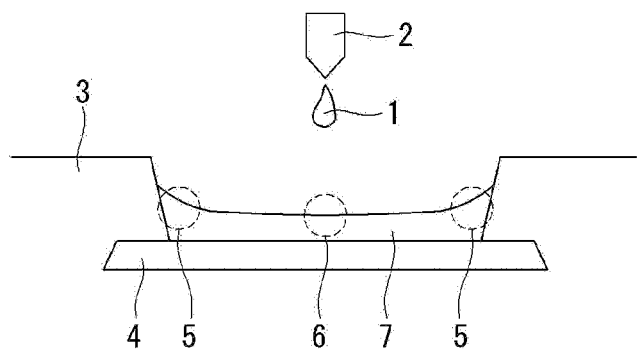
FIG. 1 is a diagram for describing problems of a solution process.

FIG. 1 is a diagram for describing problems of a solution process.

Referring to FIG. 1, when an organic emission layer is formed using the solution process (or, soluble process), pile up may occur to deteriorate the emission characteristic of an organic light emitting display device. More specifically, an organic light-emitting material 1 is dropped on a first electrode 4 defined by a bank 3 through an inkjet apparatus 2. The dropped organic light-emitting material 1 has a thickness deviation based on location due to a hardening rate difference in the hardening process. That is, an organic emission layer 7 having a thick edge 5 in contact with the bank and a thin center 6 is formed.

When the organic emission layer 7 having an ununiform thickness is formed in this manner, a luminance deviation based on location may occur to deteriorate display quality. Furthermore, a current density difference may be generated in the organic emission layer 7 to cause decrease in the lifespan of elements or dark spots may be generated to decrease process yield. In view of this, it is necessary to minimize an area in which pile up occurs in formation of an emission layer using the solution process.

First Aspect

Figure 2:
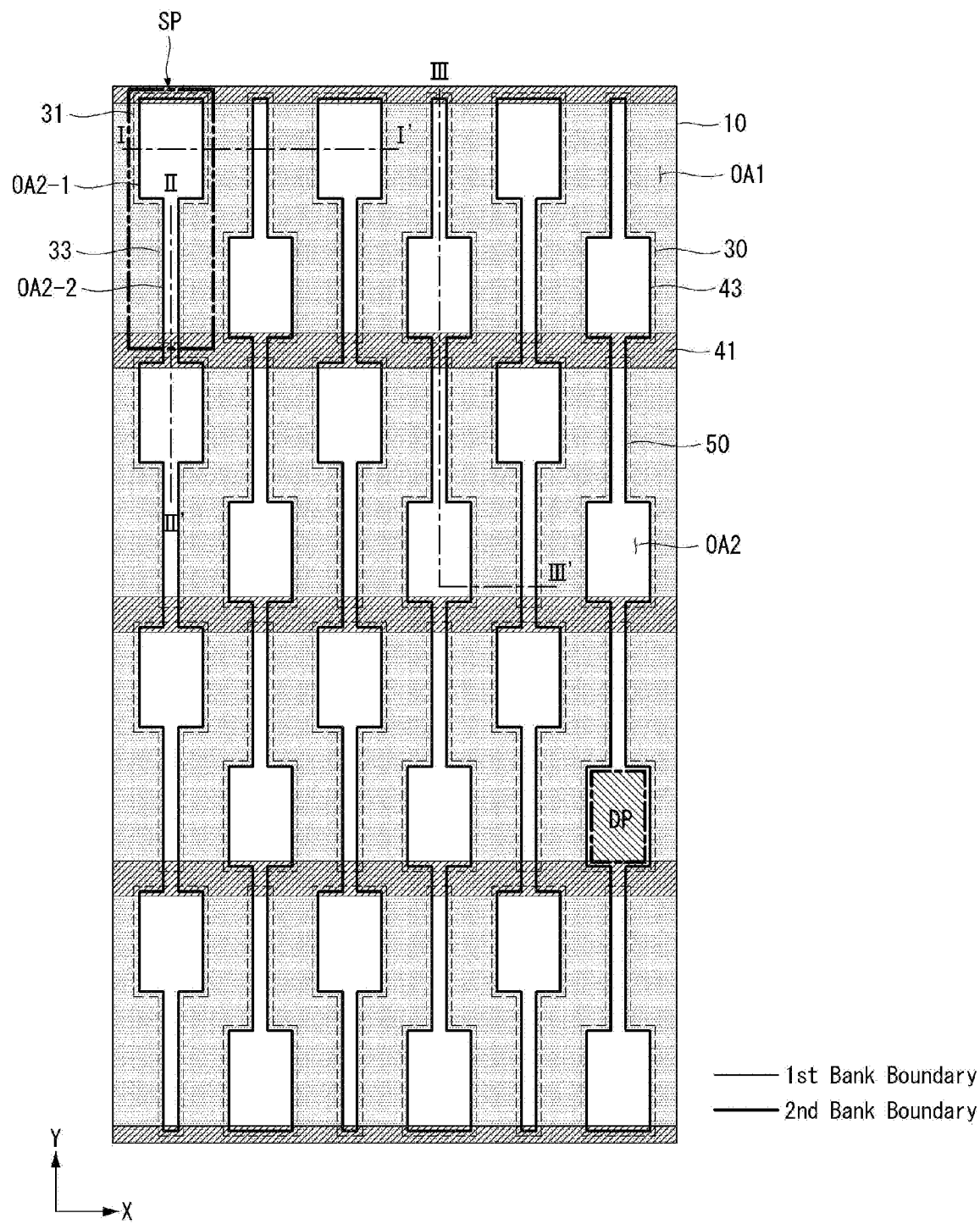
FIG. 2 is a schematic plan view showing an organic light emitting display device according to a first aspect of the present disclosure.
Figure 3A:
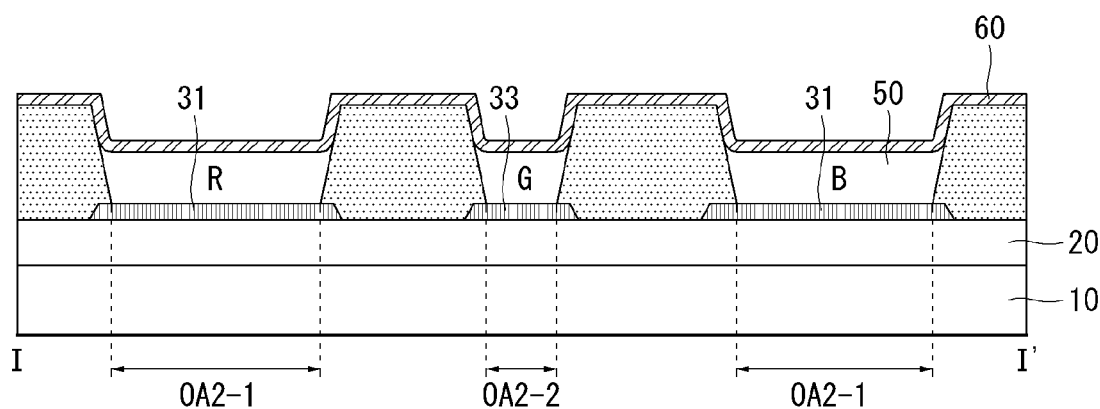
FIGS. 3A and 3B are cross-sectional views taken along lines I-I' and II-II' of FIG. 2.
Figure 3B:
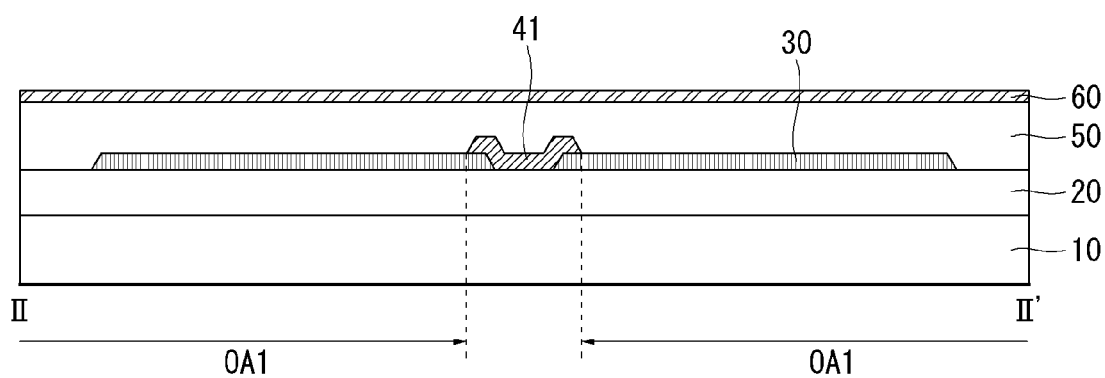

FIG. 2 is a schematic plan view showing an organic light emitting display device according to a first aspect of the present disclosure and FIGS. 3A and 3B are cross-sectional views taken along lines I-I' and II-II' of FIG. 2.

Referring to FIGS. 2, 3A and 3B, the organic light emitting display device according to the first aspect includes a substrate 10 on which sub-pixels SP are arranged. A circuit element layer 20 and organic light-emitting diodes (OLEDs) driven by elements included in the circuit element layer 20 are arranged on the substrate 10.

The circuit element layer 20 may include signal lines and electrodes arranged therein, through which driving signals are applied to the OLEDs, and the signal lines and the electrodes may be separately disposed having at least one insulating layer interposed therebetween as necessary. When the organic light emitting display device is realized as an active matrix (AM) type, the circuit element layer 20 may further include transistors allocated per sub-pixel SP. Each OLED includes a first electrode 30, a second electrode 60 and an organic emission layer 50 interposed between the first electrode 30 and the second electrode 60. The first electrode 30 may be an anode and the second electrode 60 may be a cathode. The transistors included in the circuit element layer 20 may be connected to the first electrode 30.

Sub-pixels SP may be arranged in a row direction (e.g., the X-axis direction) and a column direction (e.g., the Y-axis direction) which intersect each other. Sub-pixels SP consecutively disposed in the row direction may emit lights in different colors and sub-pixels SP consecutively disposed in the column direction may emit lights in the same color.

The first electrodes 30 of OLEDs are disposed in the sub-pixels SP. One first electrode 30 can be allocated to each sub-pixel SP.

Each of the first electrodes 30 includes a head portion 31 and a neck portion 33. The head portion 31 is a region DP to which an organic light-emitting material is dropped in a solution process and may be formed to have a predetermined first area. The head portion 31 may have a predetermined first width in the row direction. When organic light-emitting materials are not dropped to correct positions, color mixing may occur between neighboring sub-pixels SP. To prevent this, the area of the head portion 31 may be set in consideration of processing margin of the solution process.

The neck portion 33 is a portion extending from one side of the head portion 31 in the column direction. The neck portion 33 has a second area smaller than the first area. The neck portion 33 may have a predetermined second width in the row direction. The second width is set to be less than the first width.

The head portion 31 of the first electrode 30 disposed in an odd column neighbors the neck portion 33 of the first electrode 30 disposed in an even column in the row direction, and the width of the head portion 31 of the first electrode 30 disposed in the odd column may be greater than the width of the neighboring neck portion 33 of the first electrode 30 disposed in the even column in the row direction. The neck portion 33 of the first electrode 30 disposed in an odd column neighbors the head portion 31 of the first electrode 30 disposed in an even column in the row direction, and the width of the neck portion 33 of the first electrode 30 disposed in the odd column may be less than the width of the neighboring head portion 31 of the first electrode 30 disposed in the even column in the row direction.

Planar shapes of first electrodes 30 neighboring in the row direction may be in a point symmetrical relationship with respect to a point therebetween. Accordingly, the head portion 31 of one of first electrodes 30 neighboring in the row direction can neighbor the neck portion 33 of another one in the row direction, and the neck portion 33 of one of the first electrodes 30 can neighbor the head portion 31 of another one in the row direction.

In the first aspect of the present disclosure, the first electrodes 30 can be arranged in the same manner in the respective rows. That is, planar shapes of first electrodes 30 arranged in an odd row may be the same as those of first electrodes 30 arranged in an even row. In this case, the head portions 31 and the neck portions 33 can be sequentially alternately disposed in the column direction.

A bank 40 is disposed on the substrate 10 on which the first electrodes 30 are formed. The bank 40 includes a first bank 41 and a second bank 43.

The first bank 41 includes first openings OA1 that expose at least a part of the first electrode 30. The first openings OA1 are arranged in parallel in the column direction and extend in the row direction. The first openings OA1 extend in the row direction and expose a plurality of first electrodes 30 arranged in the row direction.

The first bank 41 may be disposed between first electrodes 30 neighboring in the column direction to define sub-pixels SP neighboring in the column direction. The first bank 41 may be disposed to cover one side of each of first electrodes 30 neighboring in the column direction between the first electrodes 30.

The first bank 41 may be formed relatively thin such that it can be covered by the organic emission layer 50 which will be formed later. The first bank 41 may have hydrophilicity. For example, the first bank 41 may be formed of a hydrophilic inorganic insulating material such as silicon oxide ($SiO_2$) or a silicon nitride ($SiN_x$). The first bank 41 is a hydrophilic thin film provided in order to prevent poor wettability of the first electrodes 30 due to hydrophobicity thereof and allows hydrophilic organic light-emitting materials to well spread.

Although an example in which the first openings OA1 have an approximately rectangular shape is shown in the figures, the present disclosure is not limited thereto. Further, although the figures show that the first openings OA1 have the same shape and the same area, the present disclosure is not limited thereto and at least one first opening OA1 may have a shape and/or an area different from those of another first opening OA1.

The second bank 43 is positioned on the substrate 10 on which the first bank 41 is formed. The second bank 43 includes second openings OA2 that expose at least a part of the first electrode 30. The second openings OA2 are arranged in parallel in the row direction and extend in the column direction. The second openings OA2 extend in the column direction to expose the plurality of first electrodes 30 disposed in the column direction.

The second openings OA2 include first exposure portions OA2-1 for exposing the head portions 31 of the first electrodes 30 and second exposure portions OA2-2 for exposing the neck portions 33 of the first electrodes 30. The first exposure portions OA2-1 are regions DP corresponding to the head portions 31, to which organic light-emitting materials are dropped in a solution process.

The first exposure portions OA2-1 and the second exposure portions OA2-2 may be sequentially alternately arranged in the column direction. The first exposure portions OA2-1 and the second exposure portions OA2-2 sequentially alternately arranged in the column direction are connected to form one second opening OA2.

A first exposure portions OA2-1 disposed in an odd column neighbors a second exposure portion OA2-2 disposed in an even column in the row direction. A second exposure portions OA2-2 disposed in an odd column neighbors a first exposure portion OA2-1 disposed in an even column in the row direction. Distances between first exposure portions OA2-1 and second exposure portions OA2-2 neighboring in the row direction may be the same based on location and may be selected as a minimum width that can be achieved through a process and is set such that organic light-emitting materials having different colors dropped to second openings OA2 neighboring in the row direction are not mixed.

The second bank 43 may be disposed between first electrodes 30 neighboring in the row direction to define sub-pixels SP neighboring in the row direction. The second bank 43 may be disposed to cover one side of each of first electrodes 30 neighboring in the column direction between the first electrodes 30. Here, the second bank 43 may extend zigzag in the column direction between first electrodes 30 neighboring in the row direction.

At least a part of the first electrode 30 exposed according to a combination structure of the first bank 41 and the second bank 43 can be defined as emission regions. The planar shape of the emission region may correspond to the planar shape of the first electrode 30.

The second bank 43 may have hydrophobicity. For example, the second bank 43 may have a structure in which a hydrophobic material is coated on an organic insulating material and may be formed of an organic insulating material containing a hydrophobic material. According to the hydrophobicity of the second bank 43, the organic light-emitting material forming the organic emission layer 50 can concentrate on the centers of the emission regions. Further, the second bank 43 can serve as a barrier for confining organic light-emitting materials dropped to corresponding regions in the regions such that organic light-emitting materials having different colors can be prevented from being mixed.

Although the figures show that all of the first exposure portions OA2-1 forming the second openings OA2 have the same shape and the same area, the present disclosure is not limited thereto and at least one first exposure portion OA2-1 may have a shape and/or an area different from those of another first exposure portion OA2-1. Although the figures show that all of the second exposure portions OA2-2 forming the second openings OA2 have the same shape and the same area, the present disclosure is not limited thereto and at least one second exposure portion OA2-2 may have a shape and/or an area different from those of another second exposure portion OA2-2. For example, shapes and/or areas of the first exposure portions OA2-1 and the second exposure portions OA2-2 may be appropriately selected in consideration of the lifespans of organic light-emitting materials.

The organic emission layer 50 is positioned on the substrate 10 on which the second bank 43 is formed. The organic emission layer 50 may be formed in a direction in which the second openings OA2 extend within the corresponding second opening OA2. That is, an organic light-emitting material dropped to one second opening OA2 covers the first electrodes 30 and the first bank 41 exposed through the second opening OA2. The organic emission layer 50 formed in the second opening OA2 maintains continuity on the first bank 41 without being physically separately by the first bank 41 after the hardening process.

Organic light-emitting materials having the same color are dropped to a plurality of first electrodes 30 exposed through one second opening OA2. This means that a plurality of sub-pixels SP allocated to a position corresponding to one second opening OA2 emits lights in the same color. The planar shape of the organic emission layer 50 may correspond to the planar shape of the second opening OA2.

Organic light-emitting materials having different colors can be sequentially alternately dropped to corresponding second openings OA2. The organic light-emitting materials having different colors may include organic light-emitting materials emitting lights in red, green and blue. The organic light-emitting materials having different colors may include an organic light-emitting material emitting light in white as necessary.

The second bank 43 is positioned between first electrodes 30 neighboring in the row direction. The second bank 43 prevents organic light-emitting materials having different colors dropped to second openings OA2 neighboring in the row direction from being mixed. That is, organic light-emitting materials having different colors dropped to different second openings OA2 are physically separated by the second bank 43.

In the first aspect of the present disclosure, since organic light-emitting materials can spread to a uniform thickness over a wide area in the second openings OA2 extending in the column direction, thickness non-uniformity due to the aforementioned pile-up after hardening can be improved. Accordingly, the organic light emitting display device according to the first aspect of the present disclosure can prevent deterioration in uniformity of the organic emission layer 50 to minimize display quality deterioration caused by a thickness deviation in the sub-pixels SP. In addition, uniformity of the organic emission layer 50 can be secured to prevent a decrease in the lifespans of elements and generation of dark spots.

Figure 4A:
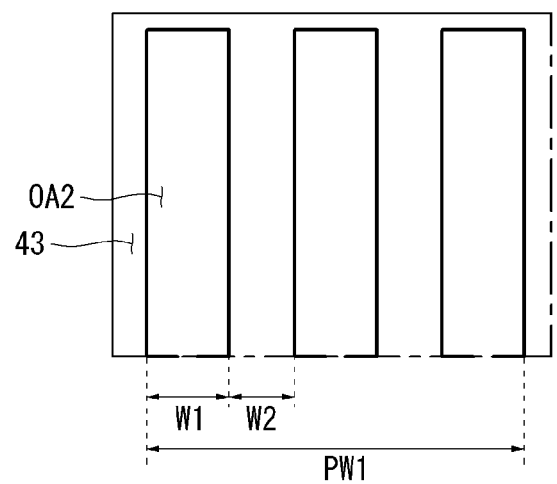
FIG. 4A shows a pixel structure according to a comparative example and FIG. 4B shows a pixel structure according to the first aspect of the present disclosure.
Figure 4B:
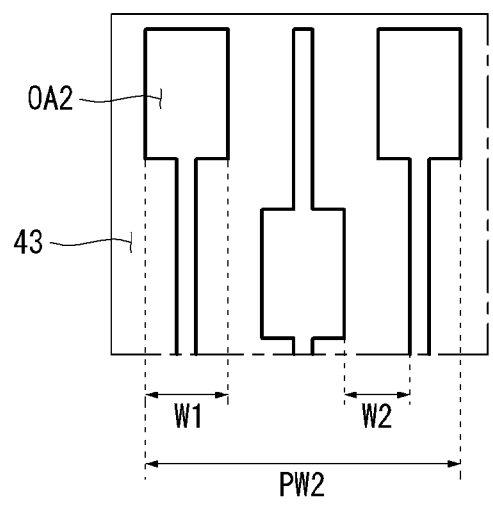

FIGS. 4A and 4B are diagrams for describing effects of the present disclosure. More specifically, FIG. 4A shows a pixel structure according to a comparative example and FIG. 4B shows a pixel structure according to the first aspect of the present disclosure. A pixel may be composed of three sub-pixels, but the present disclosure is not limited thereto.

When organic emission layers are formed through a solution process, organic light-emitting materials may not be dropped to correct positions and thus a failure due to color mixing of organic light-emitting materials having different colors may occur. To prevent this, it is necessary to secure a sufficient area in which an organic light-emitting material is dropped in consideration of processing margin. That is, the width of the second opening OA2 to which an organic light-emitting material is dropped needs to satisfy a predetermined first width W1.

In addition, to prevent generation of a failure due to mixing of organic light-emitting materials having different colors dropped to second openings OA2 neighboring in the row direction, a sufficient distance between the second openings OA2 is required. That is, the width of a part of the second bank 43 positioned between the second openings OA2 needs to satisfy a predetermined second width W2.

To satisfy the aforementioned conditions, a pixel structure may be designed in such a manner that second openings OA2 extend in the form of a stripe, as shown in FIG. 4A. In this case, however, it is difficult to control the overall width occupied by a pixel and thus the pixel structure cannot be easily applied to high-definition display devices having a high pixel per inch (PPI).

In the first aspect of the present disclosure, it is possible to control the overall width occupied by a pixel since the structure shown in FIG. 4B is employed. More specifically, when it is assumed that the first width W1 is 27 μm and the second width W2 is 15 μm, a width PW1 occupied by a pixel shown in FIG. 4A is set to 111 μm (=(27*3)+(15×2)). On the other hand, when a third width W3 of the second exposure portion OA2-2 constituting the second opening OA2 is assumed to be 5 μm under the same conditions, a width PW2 occupied by a pixel shown in FIG. 4B is reduced to 89 μm (=(27*2)+5+(15×2)). Since it is sufficient for the third width W3 to be a minimum width that can be achieved through a process, the overall width occupied by the pixel can be considerably reduced in the structure shown in FIG. 4(b) compared to the structure of FIG. 4A.

Accordingly, the first aspect of the present disclosure can be easily applied to high-definition organic light emitting display devices while preventing a failure due to color mixing.

Figure 5:
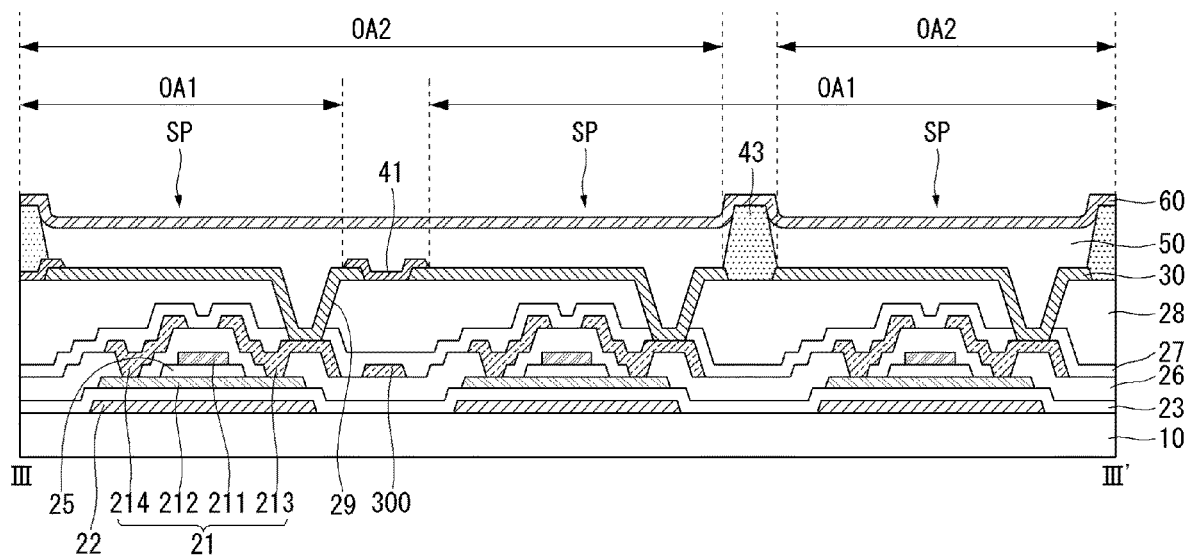
FIG. 5 is cross-sectional views taken along line III-III' of FIG. 2.

FIG. 5 is a cross-sectional view taken along line III-III' of FIG. 2.

Referring to FIG. 5, the circuit element layer 20 may include a transistor 21 electrically connected to an OLED. For example, a light shielding layer 22 is disposed on the substrate 10. The light shielding layer 22 serves to block external light to prevent generation of photo current in the transistor. A buffer layer 23 is disposed on the light shielding layer 22. The buffer layer 23 serves to protect transistors formed in a subsequent process from particles such as alkali ions leaking from the light shielding layer 22. The buffer layer 23 may be formed of a silicon oxide (SiOx), a silicon nitride (SiNx) or a multi-layer thereof.

A semiconductor layer 212 of the transistor is disposed on the buffer layer 23. The semiconductor layer 212 may be formed of silicon semiconductor or an oxide semiconductor. The silicon semiconductor may include amorphous silicon or crystalized polysilicon. The semiconductor layer 212 includes drain and source regions containing a p-type or n-type impurity, and a channel interposed therebetween.

A gate insulating layer 25 is disposed on the semiconductor layer 212. The gate insulating layer 25 may be formed of a silicon oxide (SiOx), a silicon nitride (SiNx) or a multi-layer thereof. A gate electrode 211 is disposed on a region of the gate insulating layer 25 which corresponds to a predetermined region of the semiconductor layer 212, that is, the channel when impurities have been injected. The gate electrode 211 is formed of one selected from a group consisting of molybdenum (Mo), aluminum (Al), chrome (Cr), gold (Au), titanium (Ti), nickel (Ni), neodymium (Nd) and copper (Cu), or an alloy thereof. Further, the gate electrode 211 may be a multi-layer formed of elements selected from a group consisting of molybdenum (Mo), aluminum (Al), chrome (Cr), gold (Au), titanium (Ti), nickel (Ni), neodymium (Nd) and copper (Cu), or alloys thereof. For example, the gate electrode 211 may be a double layer of molybdenum/aluminum-neodymium or molybdenum/aluminum.

An interlevel insulating layer 26 for insulating the gate electrode 211 is disposed on the gate electrode 211. The interlevel insulating layer 26 may be formed of a silicon oxide (SiOx), a silicon nitride (SiNx) or a multi-layer thereof. A source electrode 213 and a drain electrode 214 are disposed on the interlevel insulating layer 26. The source electrode 213 and the drain electrode 214 are connected to the semiconductor layer 212 through contact holes that expose the source and drain regions of the semiconductor layer 212. The source electrode 213 and the drain electrode 214 may be formed from a single layer or multi-layer. When the source electrode 213 and the drain electrode 214 are formed from a single layer, they may be formed of one of molybdenum (Mo), aluminum (Al), chrome (Cr), gold (Au), titanium (Ti), nickel (Ni), neodymium (Nd) and copper (Cu), or an alloy thereof. Further, when the source electrode 213 and the drain electrode 214 are formed from a multi-layer, they may be formed from a double layer of molybdenum/aluminum-neodymium or a triple-layer of titanium/aluminum/titanium, molybdenum/aluminum/molybdenum or molybdenum/aluminum-neodymium/molybdenum. Accordingly, the transistor 21 including the semiconductor layer 212, the gate electrode 211, the source electrode 213 and the drain electrode 214 is formed.

A passivation layer 27 is disposed on the substrate 10 including the transistor 21. The passivation layer 27 is an insulating layer for protecting elements disposed thereunder and may be formed of a silicon oxide (SiOx), a silicon nitride (SiNx) or a multi-layer thereof. An overcoat layer 28 is disposed on the passivation layer 27. The overcoat layer 28 may be a planarization layer for planarizing an uneven surface of the structure disposed thereunder and is made of an organic material such as polyimide, benzocyclobutene series resin or acrylate. The overcoat layer 28 includes a sub-pixel contact hole 29 for exposing the passivation layer 27 to expose the source electrode 213.

An OLED is formed on the overcoat layer 28. The OLED includes the first electrode 30 connected to the transistor, the second electrode 60 opposite the first electrode 30, and the organic emission layer 50 interposed between the first electrode 30 and the second electrode 60. The first electrode 30 may be an anode and the second electrode 60 may be a cathode.

The first electrode 30 may be disposed on the overcoat layer 28 and connected to the source electrode 213 of the transistor through the sub-pixel contact hole 29 penetrating the overcoat layer 28. The first electrode 30 can be allocated per sub-pixel but the present disclosure is not limited thereto. The first electrode 30 may be formed of a transparent conductive material such as indium tin oxide (ITO), indium zinc oxide (IZO) or zinc oxide (ZnO) to serve as a transparent electrode or may include a reflective layer to serve as a reflective electrode in response to an adopted emission method. The reflective layer may be formed of aluminum (Al), copper (Cu), silver (Ag), nickel (Ni) or an alloy thereof. Desirably, the reflective layer may be formed of APC (silver/palladium/copper alloy).

The bank 40 is disposed on the substrate 10 on which the first electrode 30 is formed. The bank 40 includes the first bank 41 and the second bank 43. The first bank 41 and the second bank 43 include openings that expose most of the first electrodes 30.

The organic emission layer 50 is disposed on the substrate 10 on which the bank 40 is formed. The organic emission layer 50 includes an emission layer (EML) and may further include one or more of common layers such as a hole injection layer (HIL), a hole transport layer (HTL), an electron transport layer (ETL) and an electron injection layer (EIL).

The first bank 41 includes first openings OA1 that expose a plurality of first electrodes 30 arranged in the row direction. The second bank 43 includes second openings OA2 that expose a plurality of first electrodes 30 arranged in the column direction.

Signal lines 300 connected to the transistor 21 to apply driving signals to corresponding sub-pixels may be disposed in areas in which the first bank 41 and the second bank 43 are disposed. The signal lines 300 may include gate lines for applying gate signals to sub-pixels, data lines for applying data signals, a high voltage power line for applying a high-voltage power, and a low voltage power line for applying a low-voltage power. When a compensation circuit is applied to sub-pixels as necessary, the signal lines 300 may further include a sensing line for sensing electrical characteristics of the sub-pixels.

The signal lines 300 may be disposed to overlap the first bank 41 and extend across first electrodes 30 neighboring in the column direction. Further, the signal lines 300 may be disposed to overlap the second bank 43 and extend across first electrodes 30 neighboring in the row direction.

The signal lines 300 may be formed at different levels having one or more of insulating layers 23, 26, 27 and 28 interposed therebetween in the areas corresponding to the first bank 41 and the second bank 43. For example, the gate lines may be disposed at the same level as the gate electrode 211. The data lines, the high-voltage power line and the low-voltage power line may be disposed at the same level as the source and drain electrodes 213 and 214. The sensing line may be disposed at the same level as the source and drain electrodes 213 and 214 or disposed at the same level as the light shielding layer 22. One of the signal lines 300 may be divided into a plurality of lines disposed at different levels, and the plurality of divided lines may be electrically connected through contact holes penetrating insulating layers disposed therebetween as necessary.

The second electrode 60 is disposed on the organic emission layer 50. The second electrode 60 may be formed on the overall surface of the substrate 10. The second electrode 60 may serve as a transparent electrode or a reflective electrode in response to an adopted emission method. When the second electrode 60 is a transparent electrode, the second electrode 60 may be formed of a transparent conductive material such as ITO or IZO or formed using a thin film of magnesium (Mg), calcium (Ca), aluminum (Al), silver (Ag) or an alloy thereof, which can allow light to pass therethrough.

FIGS. 6A to 6C, 7A to 7C, 8A to 8C and 9A to 9C are diagrams for describing processes of forming the first electrodes, banks and organic emission layers in chronological order.

Figure 6A:
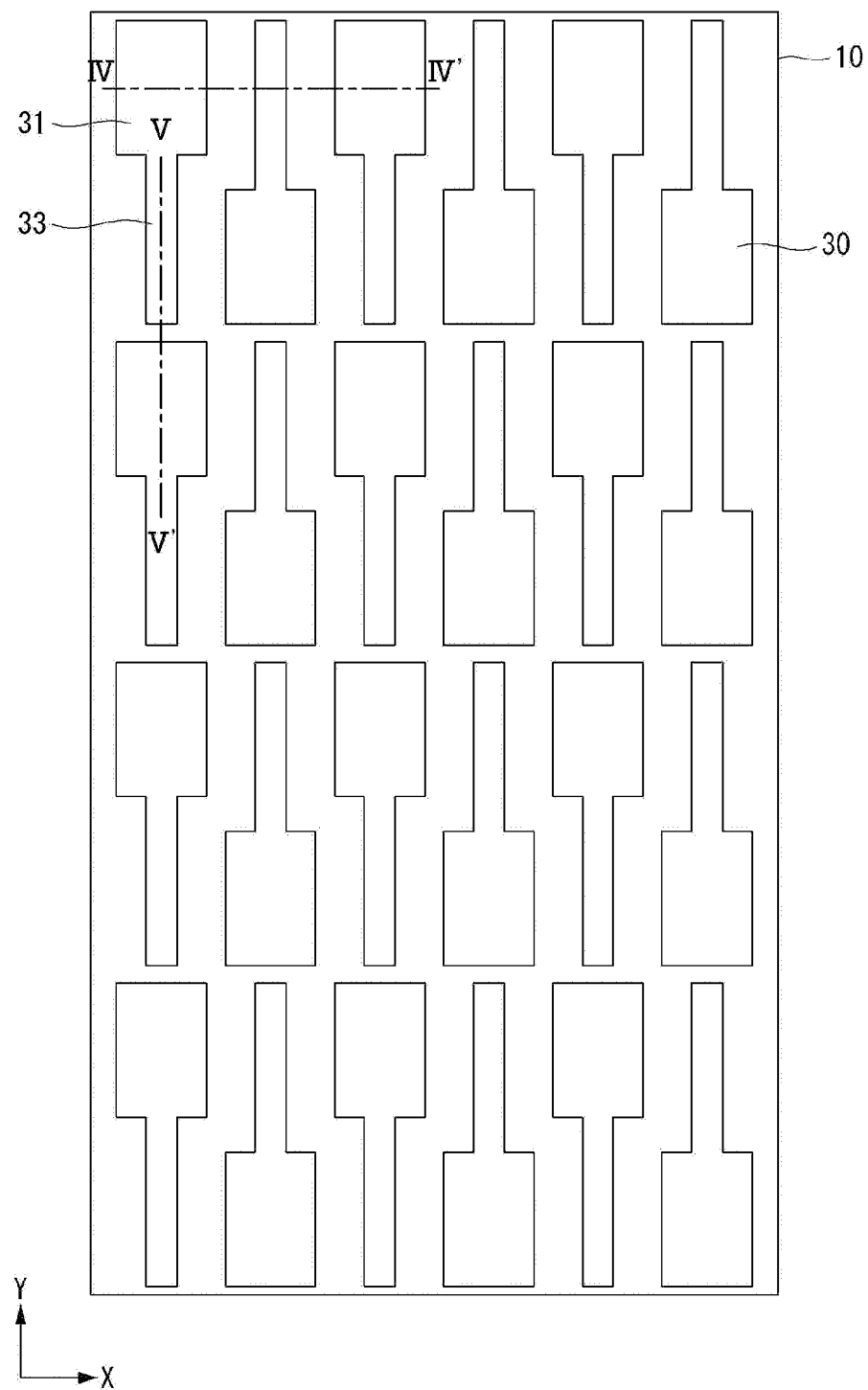
FIGS. 6A to 6C, 7A to 7C, 8A to 8C and 9A to 9C are diagrams for describing processes of forming first electrodes, banks and organic emission layers in chronological order.
Figure 6B:
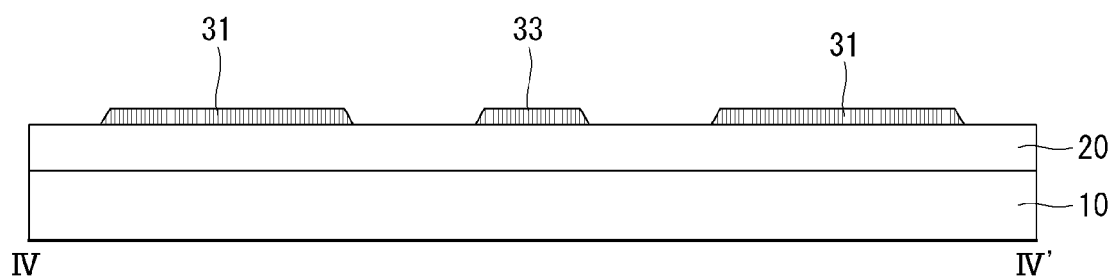
Figure 6C:
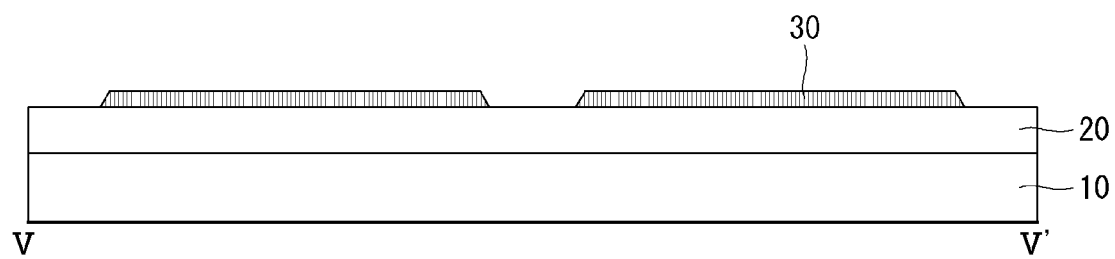

Referring to FIGS. 6A to 6C, the first electrodes 30 are formed on the substrate 10. The first electrodes 30 may be arranged in a matrix form in the row direction and the column direction, but the present disclosure is not limited thereto. The first electrodes 30 may be respectively allocated to sub-pixels SP.

Each of the first electrodes 30 includes the head portion 31 and the neck portion 33 which have different areas. The head portion 31 is a region DP to which an organic light-emitting material is dropped in a solution process and may be formed to have a predetermined first area. The head portion 31 may have the predetermined first width in the row direction. The neck portion 33 is a portion extending from one side of the head portion 31 in the column direction. The neck portion 33 has a second area smaller than the first area. The neck portion 33 may have the predetermined second width in the row direction. The second width is set to be less than the first width.

Planar shapes of first electrodes 30 neighboring in the row direction may be in a point symmetrical relationship with respect to a point therebetween. Accordingly, the head portion 31 of one of first electrodes 30 neighboring in the row direction can neighbor the neck portion 33 of another one in the row direction, and the neck portion 33 of one of the first electrodes 30 can neighbor the head portion 31 of another one in the row direction.

Figure 7A:
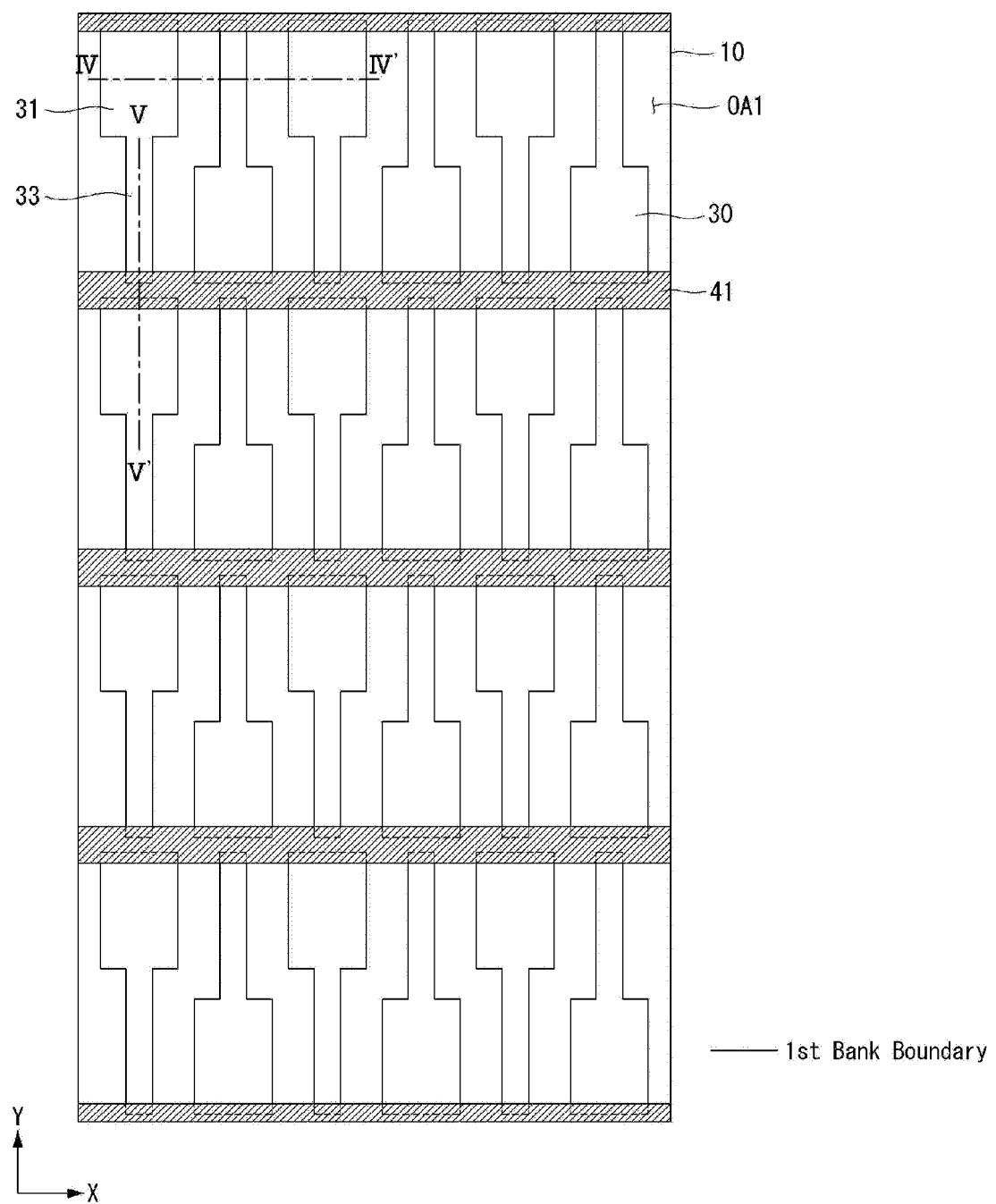
Figure 7B:
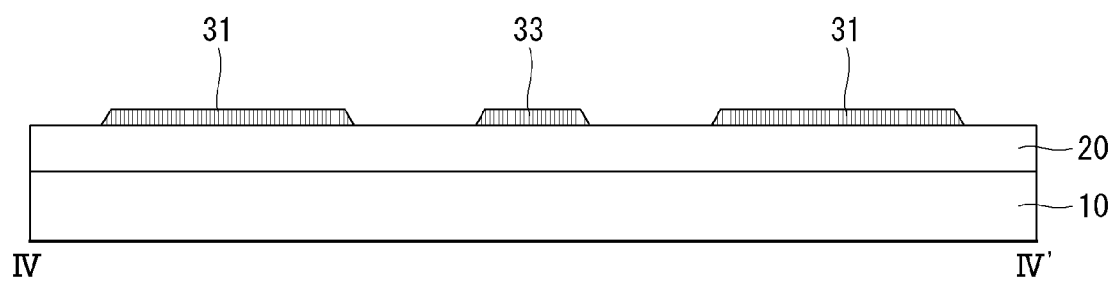
Figure 7C:
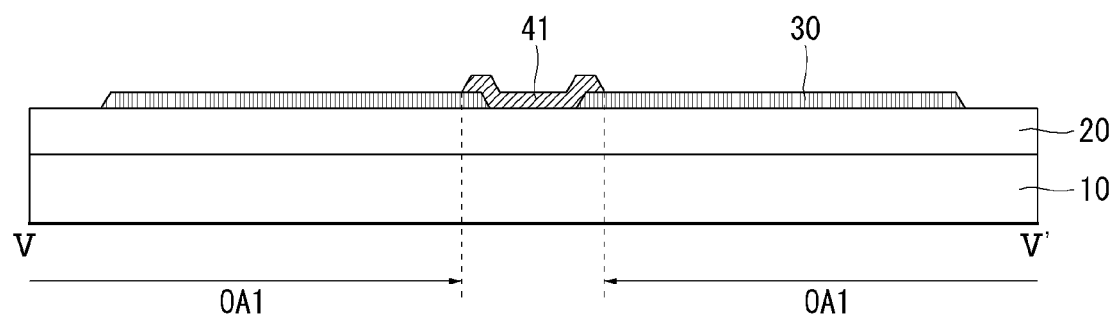

Referring to FIGS. 7A, 7B and 7C, the first bank 41 is formed on the substrate 10 on which the first electrodes 30 are formed. The first bank 41 includes first openings OA1. One first opening OA1 exposes a plurality of first electrodes 30 arranged in the row direction. The first bank 41 may be disposed between neighboring first electrodes 30 neighboring in the column direction and may not be disposed between first electrodes 30 neighboring in the row direction.

Figure 8A:
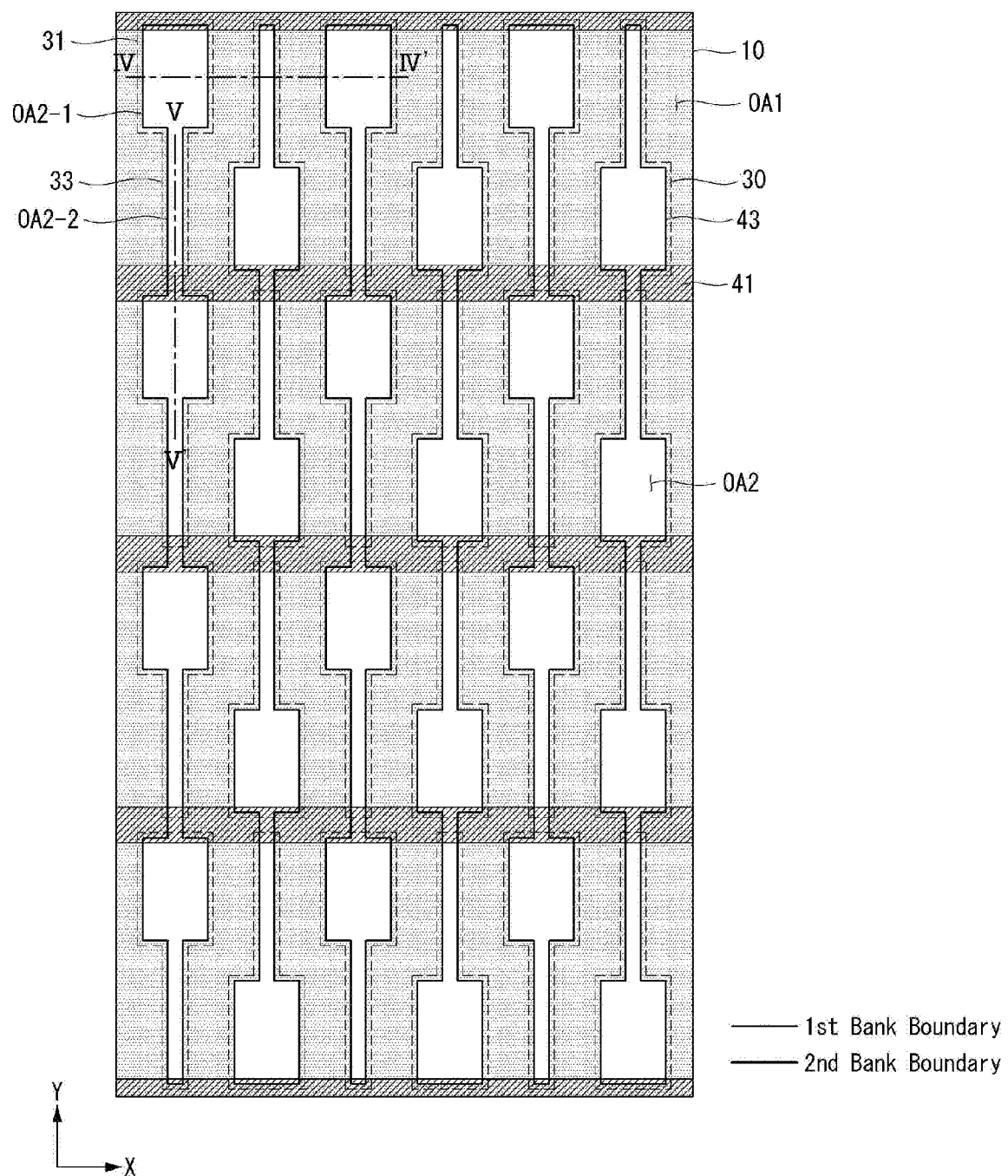
Figure 8B:
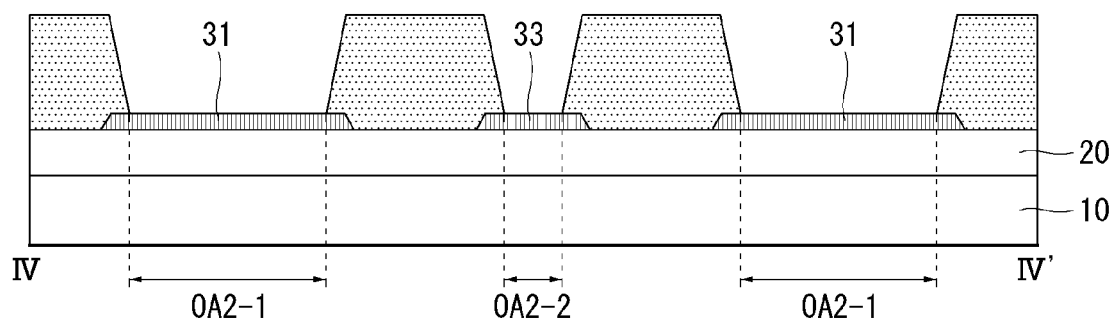
Figure 8C:
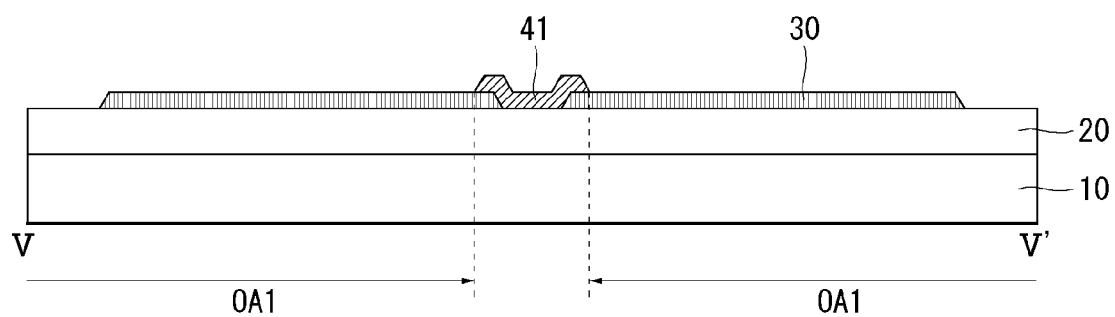

Referring to FIGS. 8A, 8B and 8C, the second bank 43 is formed on the substrate 10 on which the first bank 41 is formed. The second bank 43 includes second openings OA2. One second opening OA2 exposes a plurality of first electrodes 30 arranged in the column direction. Emission regions can be defined by the first bank 41 and the second bank 43.

The second openings OA2 include a plurality of first exposure portions OA2-1 and second exposure portions OA2-2 which have different areas and connected in the column direction. The first exposure portions OA2-1 and the second exposure portions OA2-2 of the second openings OA2 may be sequentially alternately arranged in the column direction. A first exposure portion OA2-1 and a second exposure portion OA2-2 which neighbor in the column direction are connected to each other.

The first exposure portions OA2-1 of the second openings OA2 expose the head portions 31 of the first electrodes 30. The first exposure portions OA2-1 of the second openings OA2 may further expose parts of the first bank 41. The second exposure portions OA2-2 of the second openings OA2 expose the neck portions 33 of the first electrodes 30. The second exposure portions OA2-2 of the second openings OA2 may further expose parts of the first bank 41.

Figure 9A:
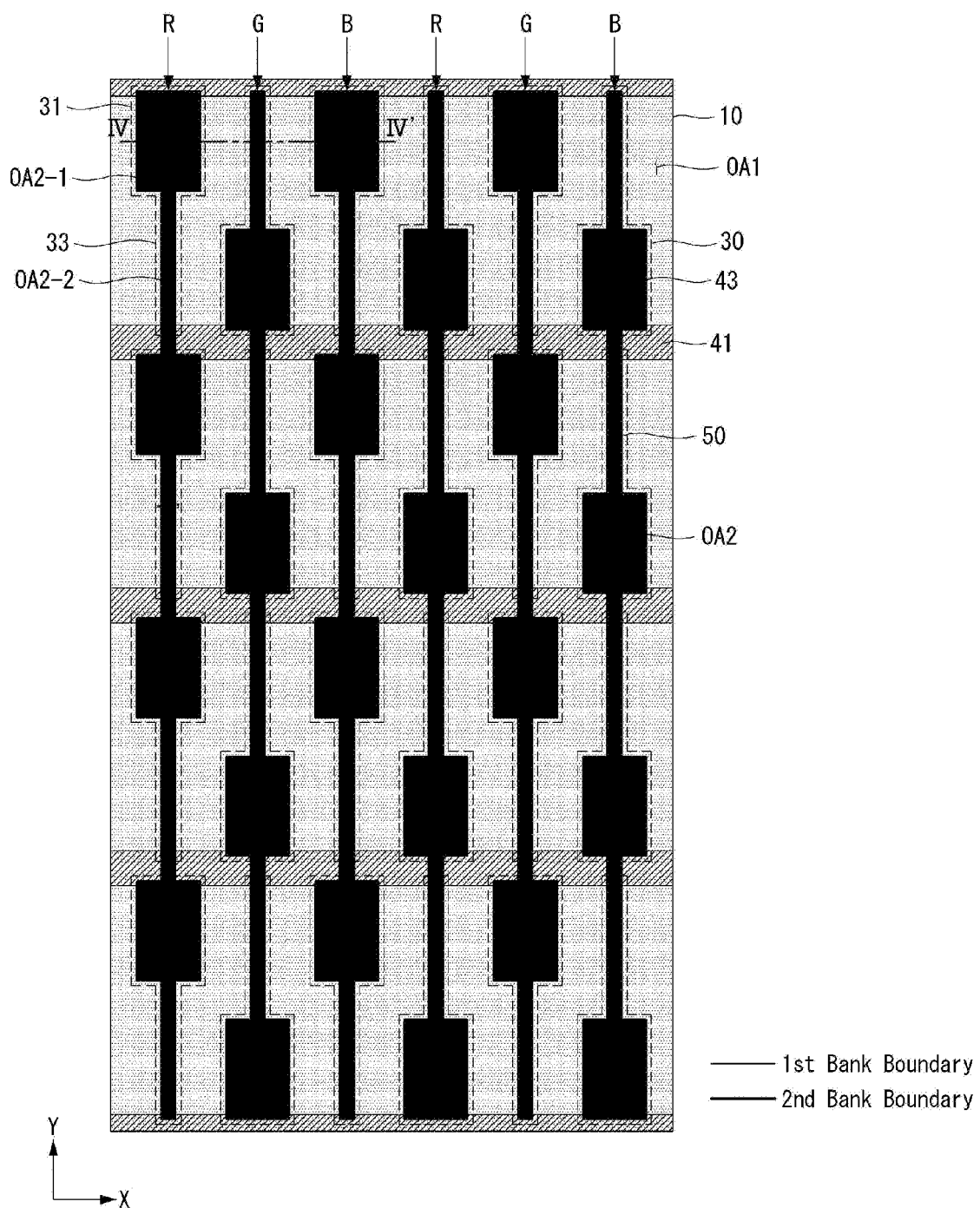
Figure 9B:
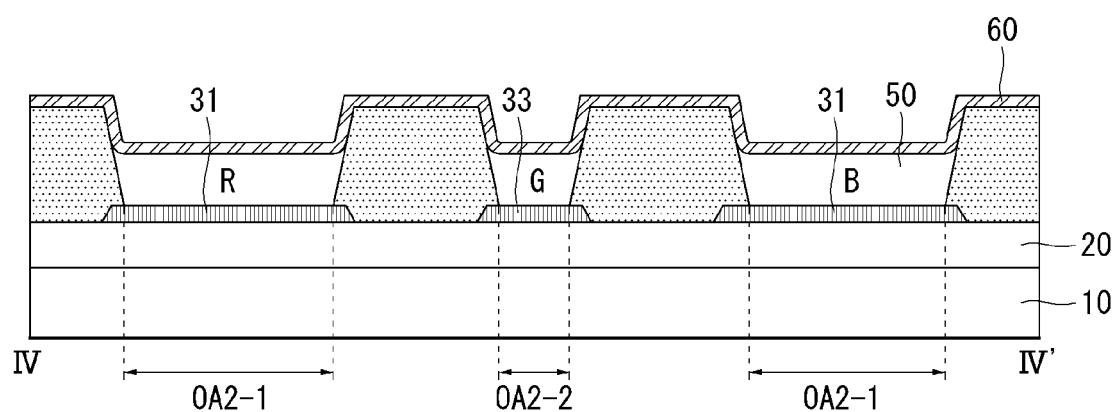
Figure 9C:
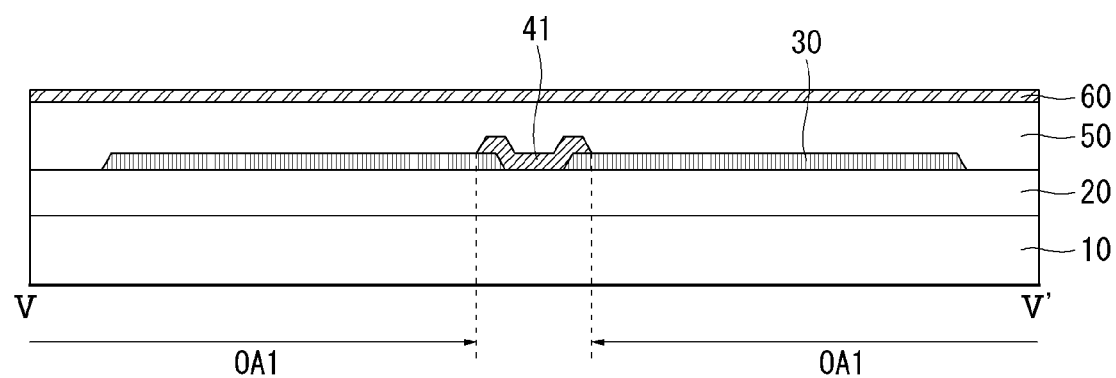

Referring to FIGS. 9A, 9B and 9C, the organic emission layer 50 and the second electrode 60 are sequentially formed on the substrate 10 on which the second bank 43 is formed.

The organic emission layer 50 may include red, green and blue organic emission layers 50. The red, green and blue organic emission layers 50 may be sequentially alternately formed in corresponding second openings OA2. For example, the red organic emission layer 50 may be allocated to a second opening OA2 disposed in the first column, the green organic emission layer 50 may be allocated to a second opening OA2 disposed in the second column, the blue organic emission layer 50 may be allocated to a second opening OA2 disposed in the third column, the red organic emission layer 50 may be allocated to a second opening OA2 disposed in the fourth column, the green organic emission layer 50 may be allocated to a second opening OA2 disposed in the fifth column, and the blue organic emission layer 50 may be allocated to a second opening OA2 disposed in the sixth column.

Second Aspect

Figure 10:
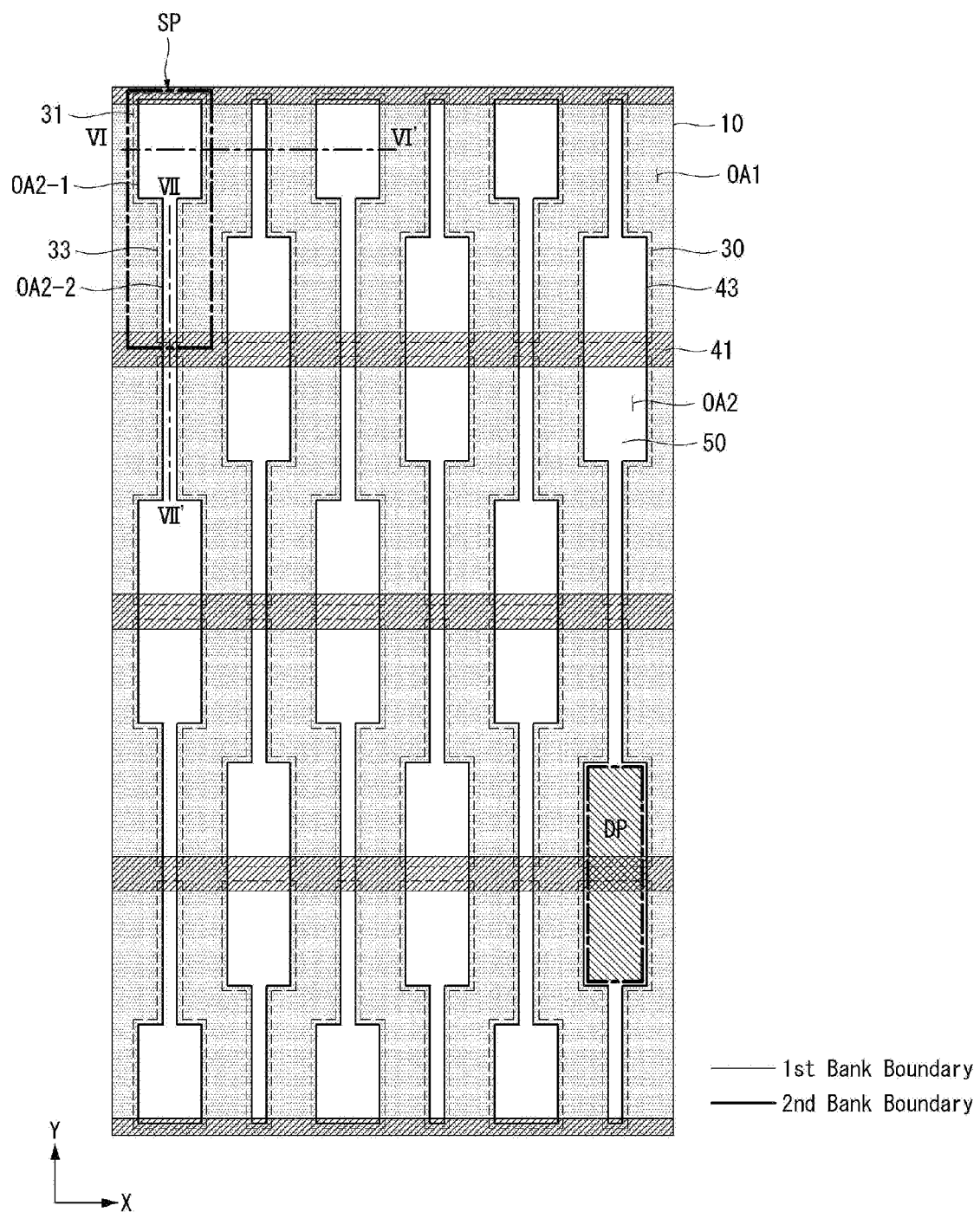
FIG. 10 is a schematic plan view showing an organic light emitting display device according to a second aspect of the present disclosure.
Figure 11A:
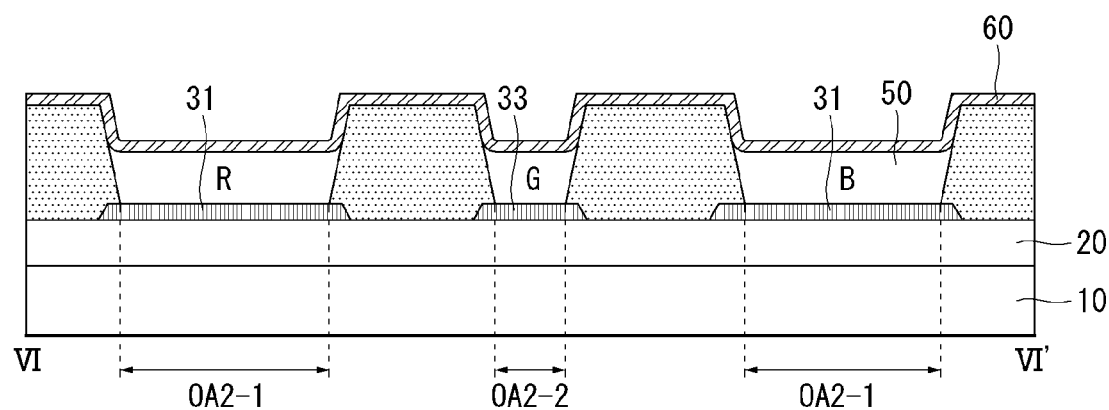
FIGS. 11A and 11B are cross-sectional views taken along lines VI-VI' and VII-VII' of FIG. 10.
Figure 11B:
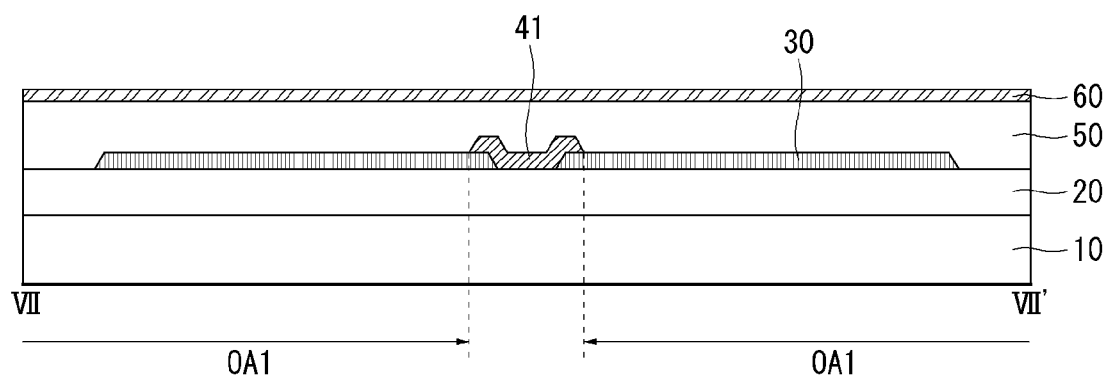

FIG. 10 is a schematic plan view showing an organic light emitting display device according to a second aspect of the present disclosure. FIGS. 11A and 11B are cross-sectional views taken along lines VI-VI' and VII-VII' of FIG. 10. In description of the second aspect, description of substantially the same components as those of the first aspect may be omitted.

Referring to FIGS. 10, 11A and 11B, the organic light emitting display device according to the second aspect includes the substrate 10 on which sub-pixels SP are arranged. The circuit element layer 20 and organic light-emitting diodes (OLEDs) driven by elements included in the circuit element layer 20 are arranged on the substrate 10.

The circuit element layer 20 may include signal lines and electrodes arranged therein, through which driving signals are applied to the OLEDs, and the signal lines and the electrodes may be separately disposed having at least one insulating layer interposed therebetween as necessary. When the organic light emitting display device is realized as an active matrix (AM) type, the circuit element layer 20 may further include transistors allocated per sub-pixel SP. Each OLED includes the first electrode 30, the second electrode 60 and the organic emission layer 50 interposed between the first electrode 30 and the second electrode 60. The first electrode 30 may be an anode and the second electrode 60 may be a cathode. The transistors included in the circuit element layer 20 may be connected to the first electrode 30.

Sub-pixels SP may be arranged in the row direction (e.g., the X-axis direction) and the column direction (e.g., the Y-axis direction) which intersect each other. Sub-pixels SP consecutively disposed in the row direction may emit lights in different colors and sub-pixels SP consecutively disposed in the column direction may emit lights in the same color.

The first electrodes 30 of OLEDs are disposed in the sub-pixels SP. One first electrode 30 can be allocated to each sub-pixel SP.

Each of the first electrodes 30 includes the head portion 31 and the neck portion 33. The head portion 31 is a region to which an organic light-emitting material is dropped in a solution process and may be formed to have a predetermined first area. The head portion 31 may have a predetermined first width in the row direction. When organic light-emitting materials are not dropped to correct positions, color mixing may occur between neighboring sub-pixels SP. To prevent this, the area of the head portion 31 may be set in consideration of processing margin of the solution process.

The neck portion 33 is a portion extending from one side of the head portion 31 in the column direction. The neck portion 33 has a second area smaller than the first area. The neck portion 33 may have a predetermined second width in the row direction. The second width is set to be less than the first width.

The head portion 31 of the first electrode 30 disposed in an odd column neighbors the neck portion 33 of the first electrode 30 disposed in an even column in the row direction, and the width of the head portion 31 of the first electrode 30 disposed in the odd column is greater than the width of the neighboring neck portion 33 of the first electrode 30 disposed in the even column in the row direction. The neck portion 33 of the first electrode 30 disposed in an odd column neighbors the head portion 31 of the first electrode 30 disposed in an even column in the row direction, and the width of the neck portion 33 of the first electrode 30 disposed in the odd column is less than the width of the neighboring head portion 31 of the first electrode 30 disposed in the even column in the row direction.

Planar shapes of first electrodes 30 neighboring in the row direction may be in a point symmetrical relationship with respect to a point therebetween. Accordingly, the head portion 31 of one of first electrodes 30 neighboring in the row direction can neighbor the neck portion 33 of another one in the row direction, and the neck portion 33 of one of the first electrodes 30 can neighbor the head portion 31 of another one in the row direction.

In the second aspect of the present disclosure, the first electrodes 30 may be arranged in different manners in an odd row and an even row. That is, planar shapes of first electrodes 30 arranged in an odd row may be axially symmetrical with planar shapes of first electrodes 30 arranged in an even row with respect to a virtual reference line extending in the row direction between the odd row and the even row. Accordingly, the head portions 31 of first electrodes 30 neighboring in the column direction can neighbor each other in a predetermined area and the neck portions 33 of the first electrodes 30 neighboring in the column direction can neighbor each other in a predetermined area.

The bank 40 is disposed on the substrate 10 on which the first electrodes 30 are formed. The bank 40 includes the first bank 41 and the second bank 43.

The first bank 41 includes a first opening OA1 that exposes at least a part of the first electrode 30. The first openings OA1 are arranged in parallel in the column direction and extend in the row direction. The first openings OA1 extend in the row direction and expose a plurality of first electrodes 30 disposed in the row direction.

The first bank 41 may be disposed between first electrodes 30 neighboring in the column direction to define sub-pixels SP neighboring in the column direction. The first bank 41 may be disposed to cover one side of each of first electrodes 30 neighboring in the column direction between the first electrodes 30.

The first bank 41 may be formed relatively thin such that it can be covered by the organic emission layer 50 which will be formed later. The first bank 41 may have hydrophilicity. For example, the first bank 41 may be formed of a hydrophilic inorganic insulating material such as silicon oxide (SiO2) or a silicon nitride (SiNx).

Although an example in which the first openings OA1 have an approximately rectangular shape is shown in the figures, the present disclosure is not limited thereto. Further, although the figures show that the first openings OA1 have the same shape and the same area, the present disclosure is not limited thereto and at least one first opening OA1 may have a shape and/or an area different from those of another first opening OA1.

The second bank 43 is positioned on the substrate 10 on which the first bank 41 is formed. The second bank 43 includes a second opening OA2 that exposes at least a part of the first electrode 30. The second openings OA2 are arranged in parallel in the row direction and extend in the column direction. The second openings OA2 extend in the column direction to expose a plurality of first electrodes 30 disposed in the column direction.

The second openings OA2 include first exposure portions OA2-1 for exposing the head portions 31 of the first electrodes 30 and second exposure portions OA2-2 for exposing the neck portions 33 of the first electrodes 30. The first exposure portions OA2-1 and the second exposure portions OA2-2 disposed in the column direction are connected to form one second opening OA2.

A first exposure portions OA2-1 disposed in an odd column neighbors a second exposure portion OA2-2 disposed in an even column in the row direction. A second exposure portions OA2-2 disposed in an odd column neighbors a first exposure portion OA2-1 disposed in an even column in the row direction. A distance between a first exposure portion OA2-1 and a second exposure portion OA2-2 which neighbor in the row direction may be selected as a minimum width that can be achieved through a process and is set such that organic light-emitting materials having different colors dropped to second openings OA2 neighboring in the row direction are not mixed.

Two first exposure portions OA2-1 that expose the head portions 31 of first electrodes 30 may be disposed such that they neighbor in the column direction in a predetermined region. Two second exposure portions OA2-2 that expose the neck portions 33 of first electrodes 30 may be disposed such that they neighbor in the column direction in a predetermined region. For example, the second openings OA2 may have a structure in which a first group including a first exposure portion OA2-1, a second exposure portion OA2-2, a second exposure portion OA2-2 and a first exposure portion OA2-1 is repeatedly arranged in the column direction or a second group including a second exposure portion OA2-2, a first exposure portion OA2-1, a first exposure portion OA2-1 and a second exposure portion OA2-2 is repeatedly arranged in the column direction. Here, the first exposure portion OA2-1, the second exposure portion OA2-2, the second exposure portion OA2-2 and the first exposure portion OA2-1 of the first group are sequentially arranged in the column direction, and the second exposure portion OA2-2, the first exposure portion OA2-1, the first exposure portion OA2-1 and the second exposure portion OA2-2 of the second group are sequentially arranged in the column direction.

As described above, an area in which two first exposure portions OA2-1 neighbor is provided in the second aspect of the present disclosure. This means that the area of a region DP to which an organic light-emitting material is dropped increases compared to the structure of the first aspect. That is, the second aspect of the present disclosure can secure sufficient areas to which organic light-emitting materials are dropped even in the column direction, compared to the first aspect, and thus can effectively prevent failure due to dropping of organic light-emitting materials to incorrect positions.

The second bank 43 may be disposed between first electrodes 30 neighboring in the row direction to define sub-pixels SP neighboring in the row direction. The second bank 43 may be disposed to cover one side of each of first electrodes 30 neighboring in the row direction between the first electrodes 30.

At least parts of the first electrodes 30 exposed according to a combination structure of the first bank 41 and the second bank 43 can be defined as emission regions. The planar shape of the emission regions may correspond to the planar shape of the first electrodes 30.

The second bank 43 may have hydrophobicity. For example, the second bank 43 may have a structure in which a hydrophobic material is coated on an organic insulating material and may be formed of an organic insulating material containing a hydrophobic material. According to the hydrophobicity of the second bank 43, the organic light-emitting material forming the organic emission layer 50 can concentrate on the centers of the emission regions. Further, the second bank 43 can serve as a barrier for confining organic light-emitting materials dropped to corresponding regions in the regions such that organic light-emitting materials having different colors can be prevented from being mixed.

Although the figures show that all of the first exposure portions OA2-1 forming the second openings OA2 have the same shape and the same area, the present disclosure is not limited thereto and at least one first exposure portion OA2-1 may have a shape and/or an area different from those of another first exposure portion OA2-1. Although the figures show that all of the second exposure portions OA2-2 forming the second openings OA2 have the same shape and the same area, the present disclosure is not limited thereto and at least one second exposure portion OA2-2 may have a shape and/or an area different from those of another second exposure portion OA2-2. For example, shapes and/or areas of the first exposure portions OA2-1 and the second exposure portions OA2-2 may be appropriately selected in consideration of the lifespans of organic light-emitting materials.

The organic emission layer 50 is positioned on the substrate 10 on which the second bank 43 is formed. The organic emission layer 50 may be formed in a direction in which the second openings OA2 extend within the corresponding second opening OA2. That is, an organic light-emitting material dropped to one second opening OA2 covers first electrodes 30 and the first bank 41 exposed through the second opening OA2. The organic emission layer 50 formed in the second opening OA2 maintains continuity on the first bank 41 without being physically separately by the first bank 41 after the hardening process.

Organic light-emitting materials having the same color are dropped to a plurality of first electrodes 30 exposed through one second opening OA2. This means that a plurality of sub-pixels SP allocated to a position corresponding to one second opening OA2 emits lights in the same color.

The planar shape of the organic emission layer 50 may correspond to the planar shape of the second opening OA2.

Organic light-emitting materials having different colors can be sequentially alternately dropped to corresponding second openings OA2. The organic light-emitting materials having different colors may include organic light-emitting materials emitting lights in red, green and blue. The organic light-emitting materials having different colors may include an organic light-emitting material emitting light in white as necessary.

The second bank 43 is positioned between first electrodes 30 neighboring in the row direction. The second bank 43 prevents organic light-emitting materials having different colors dropped to second openings OA2 neighboring in the row direction from being mixed. That is, organic light-emitting materials having different colors dropped to different second openings OA2 are physically separated by the second bank 43.

MODIFIED EXAMPLE

FIG. 12 is a diagram for describing a modified example of the present disclosure.

Figure 12A:
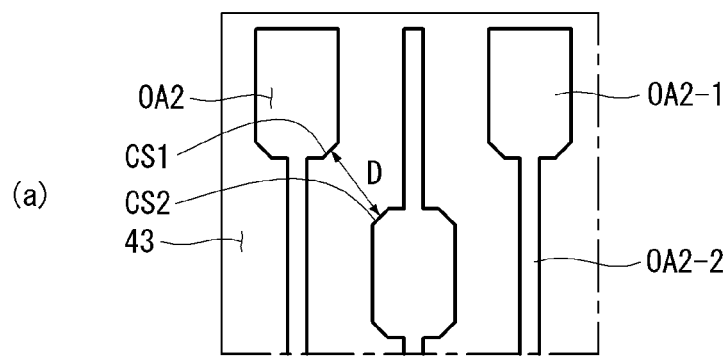
FIGS. 12A and 12B are diagrams for describing a modified example of the present disclosure.
Figure 12B:
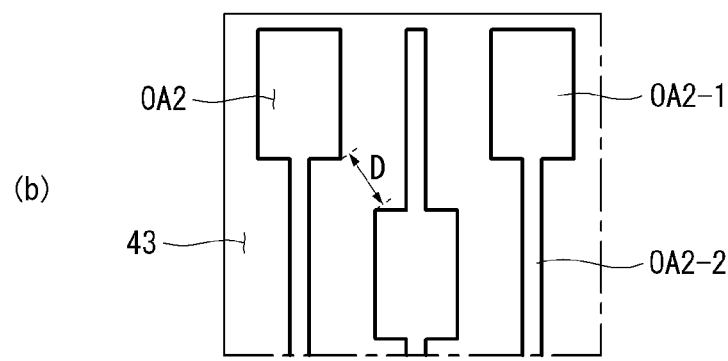

FIG. 12A schematically illustrates a structure of the second bank 43 of the modified example and FIG. 12B schematically illustrates the structure of the second bank 43 of the first aspect.

Referring to FIG. 12A, the second openings OA2 include first exposure portions OA2-1 and second exposure portions OA2-2. Each first exposure portion OA2-1 may have a planar shape with at least one chamfered side. Here, a chamfered side CS1 of a first exposure portion OA2-1 disposed in an odd column and a chamfered side CS2 of a first exposure portion OA2-1 disposed in an even column may be disposed to face each other. In this case, a distance D between the first exposure portion OA2-1 disposed in an odd column and the first exposure portion OA2-1 disposed in an even column may be increased within a limited area.

Accordingly, the modified example of the present disclosure can effectively prevent a failure caused by mixing of organic light-emitting materials having different colors respectively dropped to a first exposure portion OA2-1 disposed in an odd column and a first exposure portion OA2-1 disposed in an even column.

Those skilled in the art will appreciate that various modifications and variations can be made in the present disclosure without departing from the spirit or scope of the disclosure through the above description. Accordingly, the technical scope of the present disclosure should not be limited to the detailed description of the specification but should be determined by the claims.

What is claimed is:

1. An organic light emitting display device comprising:
   a substrate on which a plurality of sub-pixels are arranged in a column direction and a row direction;
   a plurality of first electrodes respectively allocated to the plurality of sub-pixels;
   a first bank disposed between the plurality of first electrodes neighboring in the column direction and having a plurality of first openings that exposes the plurality of first electrodes arranged in the row direction;
   a second bank disposed between the plurality of first electrodes neighboring in the row direction and having a plurality of second openings that exposes the plurality of first electrodes arranged in the column direction,
   wherein each of the plurality of first electrodes includes a head portion having a first width in the row direction and a neck portion having a second width less than the first width and extending from one side of the head portion in the column direction,
   wherein the head portion of the first electrodes arranged in an odd column neighbors the neck portion of the first electrodes arranged in an even column along the row direction, and
   wherein the neck portion of the first electrodes arranged in an odd column neighbors the head portion of the first electrodes arranged in an even column along the row direction.

2. The organic light emitting display device of claim 1, wherein planar shapes of the first electrodes arranged in an odd row are the same as planar shapes of the first electrodes arranged in an even row.

3. The organic light emitting display device of claim 2, wherein each of the second openings includes a first exposure portion exposing the head portion and a second exposure portion exposing the neck portion, and
   wherein the first exposure portion and the second exposure portion are sequentially alternately arranged in the column direction.

4. The organic light emitting display device of claim 1, wherein planar shapes of the first electrodes arranged in an odd row are axially symmetrical with planar shapes of the first electrodes arranged in an even row with respect to a reference line extending in the row direction.

5. The organic light emitting display device of claim 4, wherein the second openings include first exposure portions exposing the head portion and second exposure portions exposing the neck portion,
   wherein two first exposure portions neighbor in the column direction in a predetermined area, and
   wherein two second exposure portions neighbor in the column direction in a predetermined area.

6. The organic light emitting display device of claim 4, wherein the second openings include first exposure portions exposing the head portion and second exposure portions exposing the neck portion,
   wherein the second openings have a structure in which a first group including a first exposure portion, a second exposure portion, a second exposure portion and a first exposure portion is repeatedly arranged in the column direction or a second group including a second exposure portion, a first exposure portion, a first exposure portion and a second exposure portion is repeatedly arranged in the column direction,
   wherein the first exposure portion, the second exposure portion, the second exposure portion and the first exposure portion of the first group are sequentially arranged in the column direction, and
   wherein the second exposure portion, the first exposure portion, the first exposure portion and the second exposure portion of the second group are sequentially arranged in the column direction.

7. The organic light emitting display device of claim 3, wherein the first exposure portion disposed in an odd column neighbors the second exposure portion disposed in an even column along the row direction,
   wherein the second exposure portion disposed in an odd column neighbors the first exposure portion disposed in an even column along the row direction, and
   wherein a distance between the first exposure portion and the second exposure portion neighboring in the row direction is same.

8. The organic light emitting display device of claim 7, wherein the second bank disposed between first electrodes neighboring in the row direction extends with a zigzag pattern in the column direction.

9. The organic light emitting display device of claim 3, wherein the first exposure portion has a planar shape with at least one chamfered side.

10. The organic light emitting display device of claim 7, wherein the first exposure portion having a chamfered side disposed in the odd column and the first exposure portion having a chamfered side disposed in the even column face each other.

11. The organic light emitting display device of claim 1, wherein the first bank covers the edge of one side of each of first electrodes neighboring in the column direction between the first electrodes, and the second bank covers the edge of one side of each of first electrodes neighboring in the row direction between the first electrodes.

12. The organic light emitting display device of claim 1, further comprising organic emission layers formed in each of the second openings,
wherein the organic emission layer covers the first electrodes and the first bank exposed through the second openings.

13. The organic light emitting display device of claim 1, wherein the first electrodes neighboring in the row direction are point symmetrical with respect to a point therebetween.

14. The organic light emitting display device of claim 1, wherein a portion of the first electrodes exposed by the first bank and the second bank are defined as emission regions, and planar shapes of the emission regions correspond to the planar shapes of the first electrodes.

15. The organic light emitting display device of claim 1, wherein the first bank has hydrophilicity and the second bank has hydrophobicity.

16. The organic light emitting display device of claim 1, wherein the first openings are arranged in parallel in the column direction and extend in the row direction.

17. The organic light emitting display device of claim 1, wherein the second openings are arranged in parallel in the row direction and extend in the column direction.

18. The organic light emitting display device of claim 1, wherein the sub-pixels consecutively disposed in the row direction emit light in different colors and the sub-pixels consecutively disposed in the column direction emit light in the same color.

19. An organic light emitting display device comprising:
a substrate on which a plurality of sub-pixels are arranged in a column direction and a row direction;
a plurality of first electrodes respectively allocated to the plurality of sub-pixels;
a first bank disposed between the plurality of first electrodes neighboring in the column direction and having a plurality of first openings that exposes the plurality of first electrodes arranged in the row direction;
a second bank disposed between the plurality of first electrodes neighboring in the row direction and having a plurality of second openings that exposes the plurality of first electrodes arranged in the column direction,
wherein the head portion of the first electrodes arranged in an odd column neighbors the neck portion of the first electrodes arranged in an even column along the row direction, and
wherein the neck portion of the first electrodes arranged in an odd column neighbors the head portion of the first electrodes arranged in an even column along the row direction, and
wherein the first electrodes neighboring in the row direction are point symmetrical with respect to a point therebetween.

20. The organic light emitting display device of claim 19, wherein planar shapes of the first electrodes arranged in an odd row are the same as planar shapes of the first electrodes arranged in an even row.

\* \* \* \* \*